(12) United States Patent
Zarudniev et al.

(10) Patent No.: US 8,558,623 B2
(45) Date of Patent: Oct. 15, 2013

(54) OSCILLATING CIRCUIT WITH GIANT MAGNETORESISTANCE EFFECT JUNCTIONS

(75) Inventors: Mykhailo Zarudniev, Kiev (UA); Eric Colinet, Bois-Guillaume (FR); Patrick Villard, La Tronche (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 24 days.

(21) Appl. No.: 13/327,388

(22) Filed: Dec. 15, 2011

(65) Prior Publication Data

US 2012/0154065 A1 Jun. 21, 2012

(30) Foreign Application Priority Data

Dec. 16, 2010 (FR) ...................................... 10 60599

(51) Int. Cl.
*H03L 7/00* (2006.01)
(52) U.S. Cl.
USPC .................. 331/2; 331/46; 331/55; 331/94.1; 257/421; 428/811
(58) Field of Classification Search
USPC .......... 360/324; 257/421; 331/94.1, 2, 46, 55; 428/811
See application file for complete search history.

(56) References Cited

U.S. PATENT DOCUMENTS

| 7,349,679 | B1 | 3/2008 | Rudell et al. |
| 7,678,475 | B2 * | 3/2010 | Slavin et al. ................. 428/811 |
| 2009/0115541 | A1 | 5/2009 | Persson et al. |
| 2009/0250775 | A1 | 10/2009 | Delaet et al. |

FOREIGN PATENT DOCUMENTS

EP 2194544 A1 6/2010

OTHER PUBLICATIONS

Search Report and Written Opinion of corresponding French Application No. 1060599, mailed on Sep. 5, 2011.

* cited by examiner

*Primary Examiner* — Arnold Kinkead
(74) *Attorney, Agent, or Firm* — Baker Hostetler LLP

(57) ABSTRACT

An oscillator including two groups of elementary junctions having giant magnetoresistance effect traversed by electric currents, the junctions of each of the two groups being in series and energized by respective main currents and the voltages across the terminals of the groups being added together to provide a voltage on an output of the oscillating circuit. The voltage across the terminals of one or more junctions of a first group is applied to a first input of a phase comparator and the voltage across the terminals of one or more junctions of the other group is applied to another input of the phase comparator, the phase comparator providing on two outputs secondary currents of the same amplitude and of opposite signs, which are dependent on the mean phase difference between the voltages applied to the inputs, the secondary currents each being added to a respective main current.

10 Claims, 4 Drawing Sheets

OSCILLATING CIRCUIT WITH GIANT MAGNETORESISTANCE EFFECT JUNCTIONS

CROSS-REFERENCE TO RELATED APPLICATION

This application claims priority to foreign French patent application No. FR 10 60599, filed on Dec. 16, 2010, the disclosure of which is incorporated by reference in its entirety.

FIELD OF THE INVENTION

The invention relates to spin transfer oscillators, known as "spin torque oscillators".

This term also encompasses, in particular, oscillators based on junctions having giant magnetoresistance effect. A junction having giant magnetoresistance effect comprises two thin ferromagnetic layers separated by a non-magnetic layer. The non-magnetic layer may be electrically conducting and one then speaks of a "spin valve" or electrically insulating and one then speaks of a "tunnel junction". According to the parallel or antiparallel orientation of the magnetization of the magnetic layers, the electrical resistance in the direction perpendicular to the layers can take two different values. This results from the electrons having greater difficulty in passing for an anti-parallel magnetic orientation and from greater ease for the parallel orientation.

BACKGROUND OF THE INVENTION

In a magnetic field, one of the magnetic layers of such a junction, traversed by a current of greater density than a so-called critical density, is the site of an oscillation of its magnetization vector. This oscillation results from the ferromagnetic resonance effect specific to the material of this layer and from the so-called spin transfer effect (known as "spin-torque") which ensures compensation for the diverse losses in the material. Without the spin transfer effect, the oscillation of the magnetization vector would be damped and would dwindle progressively. Sustained by virtue of the spin transfer, the oscillation may be detected through the giant magnetoresistance effect. It is known to produce oscillators based on junctions having giant magnetoresistance effect. They can have applications in radiofrequency communications.

One of the advantages of oscillators using a junction having giant magnetoresistance effect is the very low bulk, the very high frequency of oscillation possible (for example from 5 GHz to 20 GHz), and the very broad band of adjustment of possible oscillation frequencies (through action on the current crossing the junction).

But the main drawback of these oscillators is the very low power of the signal available at output. Their frequency stability is moreover not excellent and in general they exhibit phase noise that it would be preferred not to have.

It has already been proposed to improve the frequency and to increase the power of the output signal by coupling several oscillators in such a way that they operate in synchronism with one another.

U.S. Patent Application Publication No. 2009/0115541 gives an example thereof. The junctions are coupled by a resistor. It has been noted that the phase noise and the resistance to disturbances of the oscillation were not as good as would be hoped. The disturbances envisaged here are disturbances originating from outside the oscillator: for example, in an application to a portable telephone, the disturbances may originate from the changes of magnetic or electrical environment depending on where the telephone is located. It is desired that the oscillator remains synchronized despite these disturbances, or at least that it converges very quickly to a resynchronization. The oscillator of the mentioned publication does not allow sufficiently fast resynchronization. Moreover, if it is desired to increase the output power by placing several very low power oscillators in synchronism, it is further necessary that the oscillators be in phase, failing which the signals do not add together and may even subtract from one another. The devices of the prior art do not allow this phase alignment to be done correctly.

SUMMARY OF THE INVENTION

According to the invention, there is proposed an oscillating circuit comprising two groups of n (n an integer greater than or equal to 1) elementary junctions having giant magnetoresistance effect traversed by electric currents, the junctions of each of the two groups being in series and each energized by a respective main current and the alternating voltages across the terminals of the groups being added together to provide a voltage on an output of the oscillating circuit, characterized in that the voltage across the terminals of one or more junctions of a first group is applied to a first input of a phase comparator and the voltage across the terminals of one or more junctions of the other group is applied to another input of the phase comparator, the phase comparator providing on two outputs secondary currents of the same amplitude and of opposite signs, which are dependent on the mean phase difference between the voltages applied to the inputs, the secondary currents each being added to a respective main current. The direction of connection for performing this addition is the direction which tends to reduce the mean phase difference at the input of the comparator.

If there is more than one junction in each group (n at least equal to 2), the voltage applied to the input of the phase comparator may be the voltage across the terminals of the n junctions or the voltage across the terminals of a number smaller than n of junctions in series, this number however being the same for both groups.

The phase comparator establishes an active feedback of one oscillator on the other in a direction tending to synchronize the phases of the oscillations of the two junction groups. The phase noise of the oscillation is lower than the sum of the phase noises of the individual oscillators because these phase noises are not correlated.

The oscillating circuit can furthermore comprise two voltage-current conversion circuits, each receiving the voltage across the terminals of a respective group of junctions and having an output linked to the other group so as to inject it with a current which depends on the voltage across the terminals of the first group mentioned. This arrangement creates a direct coupling between the two junctions, which is added to the indirect coupling created by the phase comparator; this coupling acts directly on the synchronization of the oscillation frequencies of the oscillators. It helps to obtain synchronism of frequencies in the event of dropout due to an electrical or magnetic disturbance in the environment of the oscillator. It also helps to obtain synchronism despite the possible technological spread between the giant magnetoresistance effect junctions. Alternatively, it is possible to envisage a single differential voltage-current conversion circuit which receives the difference of the voltages across the terminals of the two groups of junctions and which produces two currents varying in opposite directions as a function of the voltage difference, these currents being applied respectively to one and to the other group of junctions.

The phase comparator preferably comprises a shaping circuit for transforming the oscillating voltages that it receives into rectangular signals, a pulse width modulator providing pulses of variable width as a function of the phase shift of the rectangular signals, an integrator circuit receiving the pulses of variable width so as to provide a signed voltage proportional to the mean phase shift, and a voltage-current conversion circuit controlled by the integrator circuit so as to produce two currents identical in absolute value and of opposite signs, whose amplitude and sign represent the phase shift, these currents constituting the phase comparator output currents, applied to the groups of junctions.

BRIEF DESCRIPTION OF DRAWINGS

Other characteristics and advantages of the invention will become apparent on reading the detailed description which follows and which is given with reference to the appended drawings in which.

DESCRIPTION OF PREFERRED EMBODIMENTS

Figure 1:
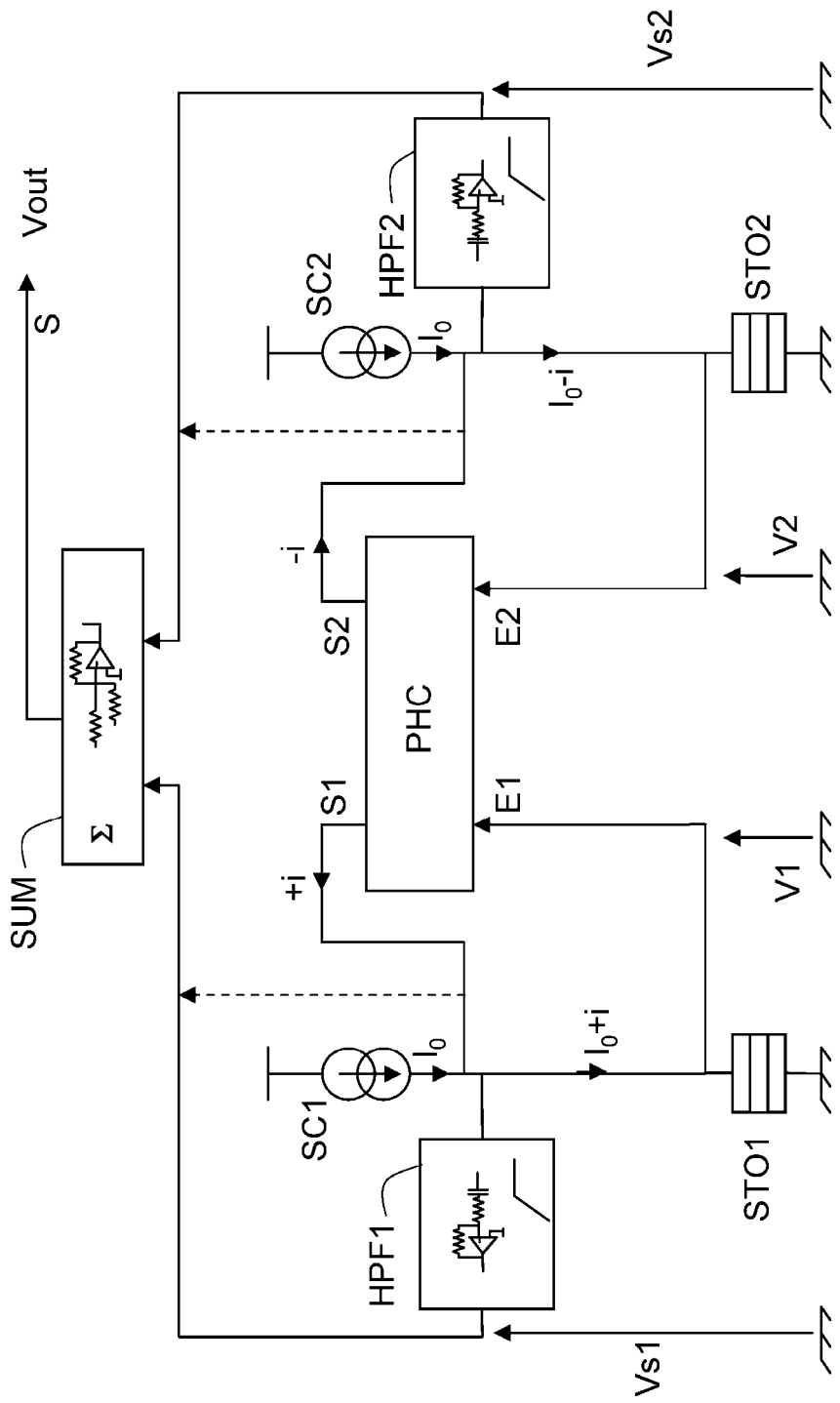
FIG. 1 represents a basic electrical diagram of the invention.

FIG. 1 represents a basic diagram of the oscillating circuit according to the invention. This diagram comprises only two giant magnetoresistance effect junctions, STO1 and STO2 respectively. It is therefore considered here artificially, that there are two groups of n junctions in series but each group comprises only a single junction (n=1).

The junctions typically consist of two thin ferromagnetic layers separated by a non-magnetic layer. The non-magnetic layer is preferably electrically insulating.

The junction STO1 is energized by a current source SC1 which provides a main reference current $I_0$; it will be seen that a secondary feedback current +i is added to the main current, so that the junction STO1 is traversed by a current $I_0$+i; symmetrically, the junction STO2 is energized by a current source SC2 which provides a main current identical to the reference current $I_0$, and it furthermore receives a secondary current −i identical, but of inverse sign, to the secondary current +i applied to the junction STO1. The junction STO2 is therefore traversed by a current $I_0$−i.

The junctions STO1 and STO2 are identical. The current sources SC1 and SC2 are also identical. The amplitudes and the oscillation frequencies of the two junctions are therefore theoretically identical.

The voltages created across the terminals of the junctions STO1 and STO2 are V1 and V2, comprising a continuous component and a high-frequency component corresponding to the oscillation frequency that it is desired to produce with this circuit. The continuous component is eliminated by a high-pass filter HPF1 linked to the junction ST1 and HPF2 linked to the junction STO2. The filtered high-frequency voltages resulting from the oscillation of the junctions STO1 and STO2 are called Vs1 and Vs2 respectively. The high-pass filters are however optional.

These voltages Vs1 and Vs2 are added together in a voltage summer SUM so as to produce on an output S a voltage Vout which is the high-frequency output voltage of the oscillating circuit of FIG. 1. But if the phases of the oscillations of the two junctions are not identical (assuming that the frequencies are rigorously identical), the summation of the voltages Vs1 and Vs2 does not culminate in an optimal increase in the amplitude of the oscillation.

A phase comparator PHC with two inputs E1 and E2 receives respectively the voltages V1 and V2 across the terminals of the two junctions. This comparator produces a differential current whose value i, signed, represents the phase shift existing between the voltages V1 and V2 received on its inputs.

The differential current is obtained at the output of the comparator, on two output terminals S1 and S2; the terminal S1 produces a current +i; the terminal S2 produces a current −i (same amplitude as the current +i and opposite sign).

The currents $I_0$+i and $I_0$−i of the junctions STO1 and STO2 therefore vary in opposite directions, thereby tending to make the oscillation frequencies vary in opposite directions. The direction of connection of the outputs of the comparator is chosen so that these opposite variations tend to stabilize the differential current i at a value which minimizes the phase difference of the oscillations.

The voltages Vs1 and Vs2 are then in phase (the high-pass filters being identical and not introducing any phase differences), and they may be added together in the summer while optimizing the addition of the amplitudes.

The phase comparator may be of very simple construction. It can comprise a shaping circuit for transforming the oscillating voltages that it receives into rectangular signals of constant amplitude; a simple amplifier with high gain may be suitable; the rising edges of the rectangular signals then define the phase of the oscillating voltage, that is to say they represent the zero-crossing of the voltage. A pulse width modulator consisting of simple logic gates receives the two voltages transformed into rectangular signals and provides pulses of variable width as a function of the phase shift of the rectangular signals. An integrator circuit receiving the pulses of variable width provides a signed voltage proportional to the mean phase shift. Finally, a voltage-current conversion circuit receives the output of the integrator circuit and produces two currents identical in absolute value and of opposite signs, whose amplitude and sign represent the phase shift. These two currents constitute the phase comparator output currents, applied to the groups of junctions.

It will be noted that instead of adding together the electrical voltages Vs1 and Vs2 in the summer SUM, it is possible to add together the unfiltered voltages V1 and V2. This possibility of addition of V1 and V2 is represented by dashed connections in FIG. 1.

Figure 2:
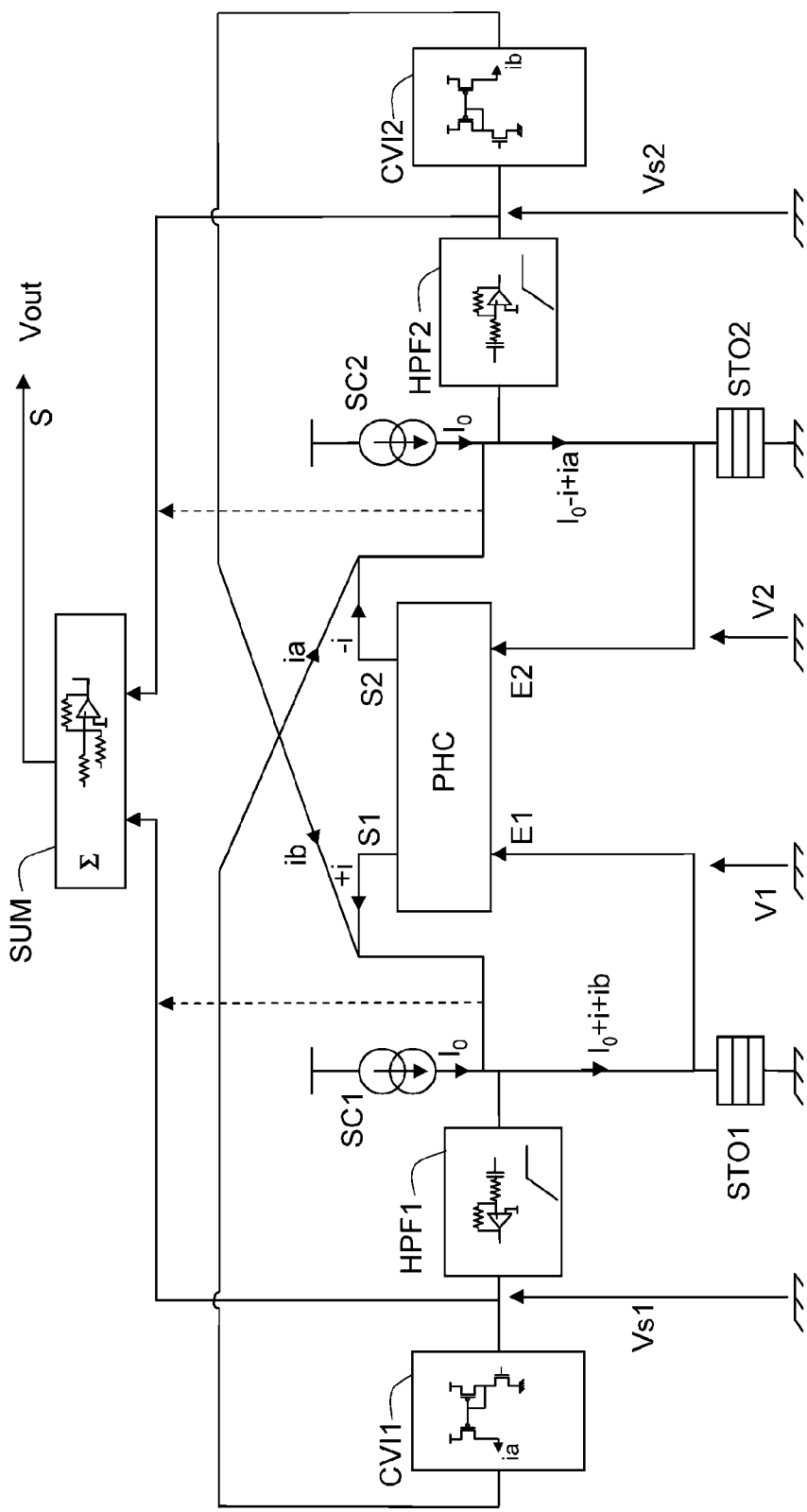
FIG. 2 represents a diagram of a variant with direct coupling between the oscillation voltage across the terminals of one junction and the current which crosses the other.

FIG. 2 represents a refinement of the oscillating circuit of FIG. 1. In this variant, provision is made for the phase slaving by the phase comparator to be supplemented with a second feedback loop by which the oscillating voltage across the terminals of each junction is converted by a respective voltage-current converter which produces a current that is reinjected into the other junction. This cross-influence from one junction to the other acts in the direction of a synchronization of the natural frequencies of the two oscillators. The adjustment of the phases through the action of the phase comparator is helped thereby in the presence of a disturbance: the synchronization of the frequencies by the converters accelerates the return to a regime that is synchronized in frequency and in phase. The disturbance may be a change in the magnetic environment, for example in an application where the oscillator provides a reference frequency for a portable telephone: the portable telephone is in essence subject to very frequent and very significant variations in the environment and it is necessary that the consequences of a disturbance on the reference frequency be eliminated as fast as possible.

In FIG. 2, the elements of FIG. 1 have been repeated and bear the same references as in FIG. 1. They will not be described again. The reinjection is done in the following manner: a voltage-current converter CVI1 (for the high-frequency voltages) is connected to the output of the high-pass filter FPH1. It produces a continuous current ia proportional to the amplitude of the oscillation voltage Vs1. This current is applied to the junction STO2 and gets added to the current $I_0$ and to the current −i, if any, produced by the phase comparator. The current in this junction is then $I_0$−i+ia. In the same way, a voltage-current converter CVI2 produces a continuous current ib proportional to the amplitude of the voltage Vs2. This current is applied to the junction STO1 and gets added to the current $I_0$ and to the current +i, if any, produced by the phase comparator. The current in this junction is then $I_0$+i+ib.

The current which passes through each junction therefore comprises a factor proportional to the voltage resulting from the oscillation of the other junction. This cross-influence contributes to the stabilization of the common oscillation frequency of the junctions. The gain of the feedback loop is less than 1, that is to say a variation in oscillation voltage of a junction induces a variation in current which itself induces in the other junction a smaller variation in oscillation voltage than the first.

The voltage-current converters may consist simply of an NMOS control transistor and a PMOS current mirror. The control transistor receives on its gate the voltage to be converted and it is loaded by a PMOS transistor mounted diode fashion (drain and gate linked together); the current of the load is dependent on the voltage applied. The load current is copied over by another PMOS transistor which has its gate and its source linked respectively to the gate and to the source of the first PMOS transistor. It produces on its drain a current ia or ib which is dependent on the input voltage Vs1 or Vs2.

Figure 3:
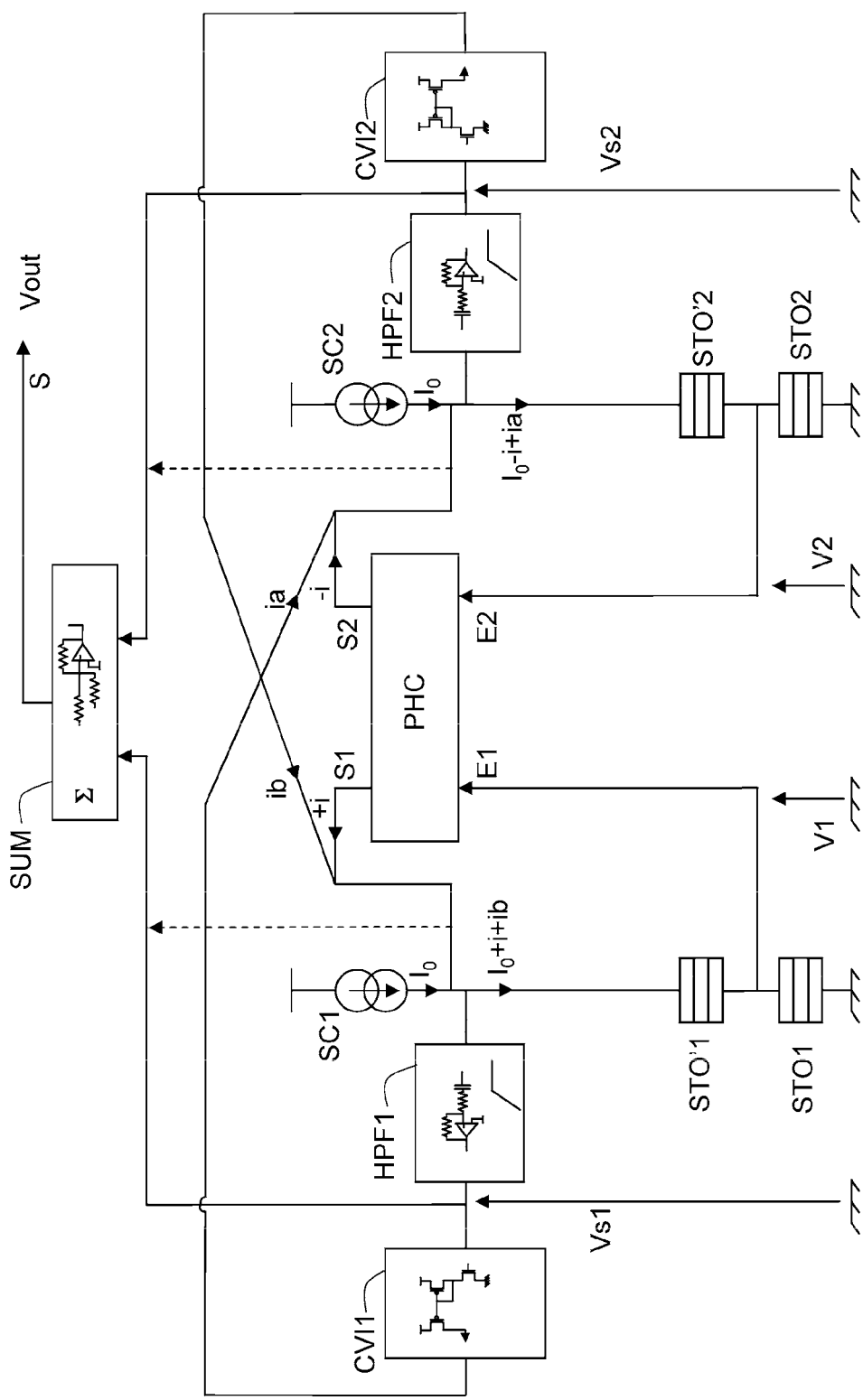
FIG. 3 represents a diagram in which each group of junctions comprises two junctions in series.

FIG. 3 represents an oscillating circuit which comprises two groups of two junctions in series. The elements common to those of FIGS. 1 and 2 are repeated and the functions of these elements will not be redescribed. The first group of junctions comprises the junction STO1 in series with an identical junction STO'1, the whole being energized with the sum of the currents $I_0$ (of the current source SC1), +i (of the phase comparator), and ib (of the voltage-current converter CVI2). The second group of junctions comprises the junction STO2 in series with an identical junction STO'2, the whole being energized with the sum of the currents $I_0$ (of the current source SC2), −i (of the phase comparator), and ia (of the voltage-current converter CVI1).

The inputs E1 and E2 of the phase comparator may be taken either across the terminals of the junctions STO1 and STO2 (as in FIGS. 1 and 2) or across the terminals of the groups in series, that is to say the input E1 would in this case receive a voltage V1+V'1 if the voltage across the terminals of STO1 is called V1 and the voltage across the terminals of STO'1 is called V'1. Likewise, the input E2 would receive a voltage V2+V'2 symmetrically.

The feedback link through the converters CVI1 and CVI2 uses in FIG. 3 the voltage V1+V'1 applied to the input of the converter CVI1 and the voltage V2+V'2 applied to the input of the converter CVI2; it therefore uses the voltage across the terminals of the groups of two junctions in series; but provision could also be made to apply the voltage across the terminals of a single junction, respectively STO1 or STO2, to the input of these converters.

Figure 4:
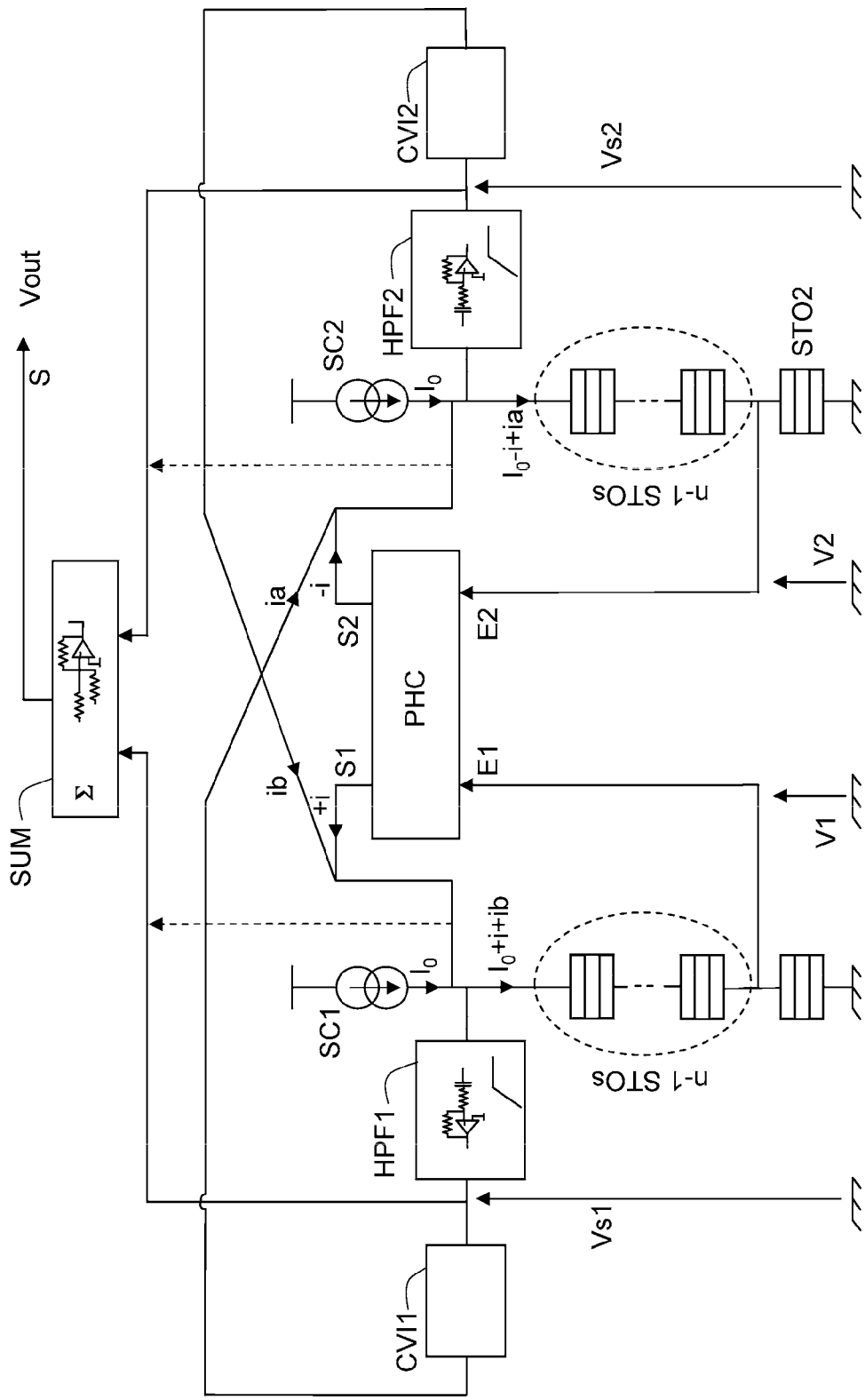
FIG. 4 represents a diagram in which each group of junctions comprises n junctions in series, n>2.

FIG. 4 represents yet another embodiment in which the giant magnetoresistance effect junctions are more numerous and laid out in two groups of n junctions, n greater than 2. The elements of FIG. 4 are the same as in FIG. 3 but it is seen that there are two sets of junctions in series. The voltages Vs1 and Vs2 across the terminals of the two sets (after high-pass filtering) are added together in the summer SUM. The feedback through the voltage-current converters is done on the basis of these voltages Vs1 and Vs2 but it could be done on the basis of voltages taken across the terminals of a number n' (n'<n) of junctions, on condition that n' is the same for both sets.

Likewise, the feedback by the phase comparator uses in FIG. 4 the voltage across the terminals of a single junction (STO1, STO2) but it could use the voltage across the terminals of several junctions in series or even all the junctions in series, on condition that this is the same number for both junction groups in series.

We claim:

1. An oscillating circuit, comprising:
   first and second groups of n elementary junctions, wherein:
   n is an integer greater than or equal to 1,
   each of the elementary junctions has a giant magnetoresistance effect,
   the elementary junctions of each of the two groups are in series,
   each of the two groups of n elementary junctions is traversed by a respective main current, and the voltages across terminals of the two groups are added together to provide a voltage on an output of the oscillating circuit,
   a voltage across the terminals of one or more elementary junctions of the first group is applied to a first input of a phase comparator,
   a voltage across the terminals of one or more elementary junctions of the second group is applied to a second, different input of the phase comparator,
   the phase comparator is configured to provide secondary currents of the same amplitude and opposite signs on two outputs of the phase comparator, where the amplitude depends on a mean phase difference between the voltages applied to the first and second inputs of the phase comparator, and
   the secondary currents are each added to a respective main current.

2. The oscillating circuit according to claim 1, wherein the phase comparator comprises:
   a shaping circuit which transforms oscillating voltages that it receives into rectangular signals,
   a pulse width modulator which provides pulses of variable width as a function of a phase shift of the rectangular signals,
   an integrator circuit which receives the pulses of variable width so as to provide a signed voltage proportional to the mean phase shift, and
   a voltage-current conversion circuit controlled by the integrator circuit so as to produce two currents identical in absolute value and of opposite signs, whose amplitude and sign correspond to the phase shift, these currents constituting the phase comparator output currents, applied to the groups of junctions.

3. The oscillating circuit according to claim 1, further comprising two voltage-current conversion circuits, each receiving the voltage across the terminals of a respective group of junctions and having an output linked to the other group so as to inject it with a current which depends on the voltage across the terminals of the respective group of junctions.

4. The oscillating circuit according to claim 2, further comprising two voltage-current conversion circuits, each receiving the voltage across the terminals of a respective group of junctions and having an output linked to the other group so as to inject it with a current which depends on the voltage across the terminals of the respective group of junctions.

5. The oscillating circuit according to claim 3, wherein the voltage-current conversion circuits each comprise a transistor receiving on its gate the voltage output of the group, so as to produce in the transistor a current dependent on the voltage applied to the gate, and a current mirror for copying over the current in the transistor, the output of the current mirror providing the conversion circuit output, linked to the other group of junctions.

6. The oscillating circuit according to claim 4, wherein the voltage-current conversion circuits each comprise a transistor receiving on its gate the voltage output of the group, so as to produce in the transistor a current dependent on the voltage applied to the gate, and a current mirror for copying over the current in the transistor, the output of the current mirror providing the conversion circuit output, linked to the other group of junctions.

7. The oscillating circuit according to claim 1, wherein n is equal to 1, such that each of the two groups of n elementary junctions comprises a single elementary junction.

8. The oscillating circuit according to claim 1, wherein n is greater than 1, and each of the voltages applied to the first and second inputs of the phase comparator is the voltage across the terminals of less than n of the elementary junctions of the respective group of n elementary junctions.

9. The oscillating circuit according to claim 1, wherein n is greater than 1, and each of the voltages applied to the first and second inputs of the phase comparator is the voltage across the terminals of n of the elementary junctions of the respective group of n elementary junctions.

10. The oscillating circuit according to claim 1, wherein each of the elementary junctions comprises two ferromagnetic layers separated by a thin electrically insulating layer, and each of the elementary junctions is placed in a magnetic field.

\* \* \* \* \*